United States Patent [19]

Baliga

[11] Patent Number: 5,412,228
[45] Date of Patent: May 2, 1995

[54] MULTIFUNCTIONAL SEMICONDUCTOR SWITCHING DEVICE HAVING GATE-CONTROLLED REGENERATIVE AND NON-REGENERATIVE CONDUCTION MODES, AND METHOD OF OPERATING SAME

[75] Inventor: Bantval J. Baliga, Raleigh, N.C.
[73] Assignee: North Carolina State University, Raleigh, N.C.
[21] Appl. No.: 194,259
[22] Filed: Feb. 10, 1994
[51] Int. Cl.$^6$ ............... H01L 29/74; H01L 27/02
[52] U.S. Cl. .................. 257/133; 257/138; 257/141; 257/167
[58] Field of Search ........... 257/138, 401, 141, 144, 257/133, 154, 167, 169, 378, 380, 175, 163

[56] References Cited

U.S. PATENT DOCUMENTS

| | | | |
|---|---|---|---|
| 3,753,055 | 8/1973 | Yamashita et al. | 317/235 R |
| 5,014,102 | 5/1991 | Adler | 357/38 |
| 5,091,766 | 2/1992 | Terashima | 357/38 |
| 5,099,300 | 3/1992 | Baliga | 357/37 |
| 5,144,400 | 9/1992 | Bauer | 357/38 |
| 5,155,569 | 10/1992 | Terashima | 357/88 |
| 5,198,687 | 3/1993 | Baliga | 257/137 |
| 5,241,194 | 8/1993 | Baliga | 257/133 |
| 5,298,769 | 3/1994 | Omura et al. | 257/138 |
| 5,349,212 | 9/1994 | Seki | 257/133 |

OTHER PUBLICATIONS

B. Jayant Baliga, "*The MOS-Gated Emitter Switched Thyristor,*" IEEE Electron Device Letters, vol. 11, No. 2, Feb. 1990, pp. 75-77.
Donald G. Fink, et al., *Electronics Engineers' Handbook,* 3d ed., 1989, Chapter 8, pp. 36-37, Chapter 12, pp. 1-12.
B. Jayant Baliga, et al., "*The Insulated Gate Transistor: A New Three-Terminal MOS-Controlled Bipolar Power Device,*" IEEE Transactions on Electron Devices, vol. ED-31, No. 6, Jun. 1984, pp. 821-828.
M. Nandakumar, et al., "*The Base Resistance Controlled Thyristor (BRT)*" A New MOS Gated Power Thyristor, IEEE, 1991, pp. 138-141.
M. Nandakumar, et al., "*A New MOS-Gated Power Thyristor Structure with Turn-Off Achieved by Controlling the Base Resistance,*" IEEE Electron Device Letters, vol. 12, No. 5, May 1991, pp. 227-229.

Primary Examiner—Mark V. Prenty
Assistant Examiner—Donald L. Morin, Jr.
Attorney, Agent, or Firm—Bell, Seltzer, Park & Gibson

[57] ABSTRACT

A semiconductor switching device having gate-controlled regenerative and non-regenerative conduction modes includes a P-N-P-N thyristor and a diverter region in a semiconductor substrate. Regenerative conduction can be initiated by electrically connecting the thyristor's cathode region and first base region in response to a first bias signal. Non-regenerative conduction can also be initiated by electrically connecting the thyristor's second base region to the diverter region in response to a second bias signal, after regenerative conduction has been initiated. Alternative, non-regenerative conduction can be initiated by electrically connecting the thyristor's second base region to the diverter region and then electrically connecting the thyristor's first base region to the cathode region. The ability to support both regenerative and non-regenerative modes of operation improves the gate-controlled turn-on and turn-off capability of the device and improves the device's I-V characteristics by providing current saturation and inhibiting sustained parasitic latch-up.

43 Claims, 6 Drawing Sheets

MULTIFUNCTIONAL SEMICONDUCTOR SWITCHING DEVICE HAVING GATE-CONTROLLED REGENERATIVE AND NON-REGENERATIVE CONDUCTION MODES, AND METHOD OF OPERATING SAME

FIELD OF THE INVENTION

The present invention relates to semiconductor switching devices, and more particularly to gate-controlled thyristors.

BACKGROUND OF THE INVENTION

The silicon bipolar transistor has been the device of choice for motor drive circuits, appliance controls, robotics and lighting ballasts. This is because bipolar transistors can be designed to handle relatively large current densities in the range of 40–50 A/cm$^2$ and support relatively high blocking voltages in the range of 500–1000 V.

Despite the attractive power ratings achieved by bipolar transistors, there exist several fundamental drawbacks to their suitability for all high power applications. First of all, bipolar transistors are current controlled devices which require relatively large base currents, typically one fifth to one tenth of the collector current, to maintain the transistor in an operating mode. Proportionally larger base currents can be expected for applications which also require high speed turn-off. Because of the large base current demands, the base drive circuitry for controlling turn-on and turn-off is relatively complex and expensive. Bipolar transistors are also vulnerable to premature breakdown if a high current and high voltage are simultaneously applied to the device, as commonly required in inductive power circuit applications. Furthermore, it is relatively difficult to operate bipolar transistors in parallel because current diversion to a single transistor typically occurs at high temperatures, making emitter ballasting schemes necessary.

The silicon power MOSFET was developed to address this base drive problem. In a power MOSFET, the gate is used to provide turn-on and turn-off control upon the application of an appropriate gate signal bias. For example, turn-on in an N-type enhancement MOSFET occurs when a conductive N-type inversion layer is formed in the P-type channel region in response to the application of a positive gate bias. The inversion layer electrically connects the N-type source and drain regions and allows for majority carrier conduction therebetween. The power MOSFET's gate electrode is separated from the channel region by an intervening insulating layer, typically silicon dioxide. Because the gate is insulated from the channel region, little if any gate current is required to maintain the MOSFET in a conductive state or to switch the MOSFET from an on-state to an off-state or vice-versa. The gate current is kept small during switching because the gate forms a capacitor with the MOSFET's channel region. Thus, only charging and discharging current ("displacement current") is required during switching. Because of the high input impedance associated with the insulated-gate electrode, minimal current demands are placed on the gate and the gate drive circuitry can be easily implemented.

Moreover, because current conduction in the MOSFET occurs through majority carrier transport only, the delay associated with the recombination of excess minority carriers is not present. Accordingly, the switching speed of power MOSFETs can be made orders of magnitude faster than that of bipolar transistors. Unlike bipolar transistors, power MOSFETs can be designed to withstand high current densities and the application of high voltages for relatively long durations, without encountering the destructive failure mechanism known as "second breakdown". Power MOSFETs can also easily be paralleled, because the forward voltage drop of power MOSFETs increases with increasing temperature, thereby promoting an even current distribution in parallel connected devices.

These benefits are offset, however, by the relatively high on-resistance of the MOSFET's active region, which arises from the absence of minority carrier injection. As a result, the device's operating forward current density is limited to relatively low values, typically in the range of 10 A/cm$^2$, for a 600 V device, as compared to 40–50 A/cm$^2$ for the bipolar transistor. These and other features of the silicon power MOSFET are fully explained in a textbook by inventor B. J. Baliga entitled "*Modern Power Devices*", John Wiley & Sons, Chapter 6, pp. 263–343 (1987).

On the basis of these features of power bipolar transistors and MOSFET devices, hybrid devices embodying a combination of bipolar current conduction with MOS-controlled current flow were developed and found to provide significant advantages over single technologies such as bipolar or MOSFET alone. One example of a hybrid device is the Insulated Gate Bipolar Transistor (IGBT), disclosed in section 7.2 of the aforementioned Baliga textbook.

The IGBT combines the high impedance gate of the power MOSFET with the small on-state conduction losses of the power bipolar transistor. An added feature of the IGBT is its ability to block both forward and reverse bias voltages. One embodiment of an IGBT is disclosed in an article by inventor B. J. Baliga and M. S. Adler, R. P. Love, P. V. Gray and N. Zommer, entitled "*The Insulated Gate Transistor: A New Three terminal MOS Controlled Bipolar Power Device,*" IEEE Trans. Electron Devices, ED-31, pp. 821–828 (1984), the disclosure of which is hereby incorporated herein by reference. Based on experimental results, on-state losses were shown to be greatly reduced when compared to power MOSFETs. This was caused by the conductivity modulation of the IGBT's drift region during the on-state. Moreover, very high conduction current densities in the range of 200–300 A/cm$^2$ were also achieved. Accordingly, an IGBT can be expected to have a conduction current density approximately 20 times that of a power MOSFET and five (5) times that of an equivalent bipolar transistor. Typical turn-off times for the IGBT can be expected to be in the range of 10–50 μs.

The basic structure of the IGBT is shown in cross-section in FIG. 1A, which is a reproduction of FIG. 1 from the aforementioned Baliga et al. article. In the IGBT, forward conduction can occur by positively biasing the collector with respect to the emitter and applying a positive gate bias of sufficient magnitude to invert the surface of the P-base region under the gate. By creating an inversion layer in the P-base region, electrons are allowed to flow from the N+emitter region to the N-base region. In this forward conducting state, the junction J2 is forward biased and the P+collector region injects holes into the N-Base region. As the collector forward bias is increased, the injected hole concentration increases until it exceeds the background doping level of the N-base. In this regime of operation, the device operates like a forward-biased P-i-N diode with heavy conductivity modulation of the N-base region.

Accordingly, the IGBT can operate at high current densities even when designed for operation at high blocking voltages. As long as the gate bias is sufficiently large to produce enough inversion layer charge for providing electrons into the N-base region, the IGBT forward conduction characteristics will look like those of a P-i-N diode. However, if the inversion layer conductivity is low, a significant voltage drop will begin to appear across this region like that observed in conventional MOSFETs. At this point, the forward current will saturate and the device will operate in its active or current saturation region, as shown in FIG. 1B, which is a reproduction of FIG. 2 from the aforementioned Baliga et al. article. As will be understood by those skilled in the art, high voltage current saturation is ultimately limited by avalanche induced breakdown. Finally, because the elimination of the inversion layer cuts off the supply of electrons into the N-base region and because there is no self-sustaining source of electrons to the N-base region, the IGBT will turn off even if the collector remains positively biased. Thus, regenerative (self-sustaining) conduction cannot be established in an IGBT.

It is recognized that although gate-controlled bipolar transistors, such as the IGBT, represent a significant improvement over using bipolar or MOSFET devices alone, even lower conduction losses can be expected by using a thyristor. This is because thyristors offer a higher degree of conductivity modulation and a lower forward voltage drop when turned on. Consequently, the investigation of thyristors is of great interest so long as adequate methods for providing forced gate turn-off can also be developed. As will be understood by one skilled in the art, a thyristor in its simplest form comprises a four-layer P1-N1-P2-N2 device with three P-N junctions in series: J1, J2, and J3, respectively. The four layers correspond to the anode (P1), the first base region (N1), the second base or P-base region (P2) and the cathode (N2), respectively. In the forward blocking state, the anode is biased positive with respect to the cathode and junctions J1 and J3 are forward biased and J2 is reversed-biased. Most of the forward voltage drop occurs across the central junction J2. In the forward conducting state, all three junctions are forward biased and the voltage drop across the device is very low and approximately equal to the voltage drop across a single forward biased P-N junction.

An inherent limitation to the use of thyristors for high current applications is sustained latch-up, however, arising from the cross-coupled P1-N1-P2 and N1-P2-N2 bipolar transistors which make up the four layers of the thyristor. This is because sustained thyristor latch-up can result in catastrophic device failure if the latched-up current is not otherwise sufficiently controlled by external circuitry or by reversing the anode potential. Sustained latch-up can occur, for example, when the summation of the current gains for the thyristor's cross-coupled P1-N1-P2 and wide base P1-N2-P2 transistors ($a_{pnp}$, $a_{pnp}$) exceeds unity. When this occurs, each transistor drives the other into saturation and provides the other with a self-sustaining (i.e., regenerative) supply of carriers to the respective transistor's base region. An alternative to providing external circuitry or reversing the anode potential to obtain turn-off, however, is to use a MOS-gate for controlling turn-on and turn-off.

Several methods for obtaining MOS-gated control over thyristor action, including latch-up, exist. For example, an original embodiment of a Base-Resistance Controlled Thyristor (BRT) is described in U.S. Pat. No. 5,099,300, to B. J. Baliga, and in an article entitled "A New MOS-Gated Power Thyristor Structure with Turn-Off Achieved by Controlling the Base Resistance," by M. Nandakumar, B. J. Baliga, M. Shekar, S. Tandon and A. Reisman, IEEE Electron Device Letters, Vol. 12, No. 5, pp. 227–229, May, 1991, both of which are hereby incorporated herein by reference. Another example of a BRT having single-polarity and dual-polarity turn-on and turn-off control is disclosed in U.S. Pat. No. 5,198,687 to B. J. Baliga, the disclosure of which is hereby incorporated herein by reference. Finally, a BRT having a common gate electrode 27 for providing both MOS-gated turn-on and turn-off is disclosed in U.S. Pat. No. 5,155,569 to Terashima. These embodiments of BRTs operate by modulating the lateral P-base resistance of the thyristor using MOS-gated control. Operational BRTs with 600-volt forward blocking capability, such as the one shown in FIG. 2, have been developed. FIG. 2 is a reproduction of FIG. 7 from the aforementioned Baliga '300 patent.

As will be understood by those skilled in the art, the BRT of U.S. Pat. No. 5,099,300 can be turned-off by the application of a negative bias to a P-channel enhancement-mode MOSFET to thereby reduce the resistance of the P-base by shunting majority charge carriers to the cathode. The reduction in P-base resistance results in an increase in the device's holding current to a level above the operational current level and shuts-off the device. Unfortunately, although conventional BRTs are characterized by low on-state voltage drop, they are not designed to exhibit the high current saturation mode of operation exhibited by conventional IGBTs. Moreover, depending on the doping concentration in the P-base region and other aspects, conventional BRTs may still be susceptible to sustained parasitic latch-up.

Thus, notwithstanding the preferred characteristics of IGBTs and BRTs, there continues to be a need for a semiconductor switching device for high current and high blocking voltage applications which has both low on-state resistance, as with the BRT, and has high current saturation capability, as with the IGBT.

SUMMARY OF THE INVENTION

It is therefore an object of the present invention to provide a semiconductor switching device which is capable of supporting high current densities and high blocking voltages.

It is another object of the present invention to provide a semiconductor switching device having low on-state resistance.

It is still another object of the present invention to provide a semiconductor switching device having a high current saturation mode of operation.

These and other objects are provided, according to the present invention by a multifunctional semiconductor switching device having gate-controlled regenerative and non-regenerative modes of operation. In the regenerative (self-sustaining) mode of operation, the switching device operates as a thyristor by latching on and supporting relatively high current densities with low on-state resistance and low on-state voltage drop. However, in the non-regenerative mode of operation, the switching device operates as an insulated gate bipolar transistor and exhibits current saturation at varying levels, based on the magnitude of an applied gate bias.

In particular, the multifunctional semiconductor switching device comprises cross-coupled P-N-P and N-P-N transistors, which are formed by adjacent P-N-P-N regions in a semiconductor substrate. In a vertical embodiment of the switching device, the P-N-P-N regions extend between opposing anode and cathode contacts, on opposing faces of the substrate, and include an anode region, a first base region, a second base region and a cathode region. In a lateral embodiment, the P-N-P-N regions extend between adjacent anode and cathode contacts, on a face of the substrate.

In addition, base resistance control is provided by a diverter region in the substrate and an insulated gate field effect transistor (e.g., MOSFET), which extends between the second base region and the diverter region and electrically connects these regions in response to an appropriate gate bias signal.

A separate insulated gate field effect transistor is also provided between the cathode region and first base region and electrically connects these regions in response to another gate bias signal. The two insulated gate field effect transistors each have independently controllable gate electrodes for controlling: (i) turn-on and regenerative latching of the coupled regions, (ii) non-regenerative conduction between the anode and cathode regions and (iii) turn-off.

According to the invention, the semiconductor switching device formed by (i) the cross-coupled P-N-P and N-P-N transistors, (ii) the diverter region and (iii) the two separately controllable insulated gate field effect transistors, can be preferably operated in both regenerative and non-regenerative modes of operation. In the regenerative mode of operation, the device can be operated as a vertical or lateral base resistance controlled thyristor (BRT) with low on-state resistance and low on-state voltage drop. In the non-regenerative mode of operation, the device can be operated as an insulated-gate bipolar transistor (IGBT) to exhibit current saturation and prevent parasitic latch-up.

A preferred method for operating the switching device includes the steps of enabling non-regenerative conduction in the device both before and after the device is turned on and latched into a regenerative mode of conduction. In this manner, turn-on and turn-off of the device can be carefully controlled by initiating non-regenerative conduction before the device is latched on, and also after the device is latched on in order to turn off the device in a controlled manner.

In particular, non-regenerative conduction in the device can be enabled by biasing the anode region positively with respect to the cathode region and electrically connecting the second base region to the diverter region. This is followed by the step of electrically connecting the first base region to the cathode region in order to provide base drive current and turn on a portion of the device by allowing non-regenerative conduction therein. Alternatively, these steps for initiating non-regenerative conduction can occur simultaneously. Next, the second base region and diverter region are electrically disconnected in order to turn on and latch the thyristor in a regenerative mode of conduction.

Finally, to turn off the device, the second base region is electrically connected to the diverter region in order to suppress regenerative conduction while allowing non-regenerative conduction and then the first base region is electrically disconnected from the cathode region, thereby turning off the device and preventing forward conduction therein. Thus, by electrically connecting the cathode region to the first base region, both regenerative and non-regenerative conduction can be supported. However, by electrically connecting the second base region to the diverter region, regenerative conduction is prevented, but non-regenerative conduction is allowed.

DESCRIPTION OF A PREFERRED EMBODIMENT

The present invention will now be described more fully hereinafter with reference to the accompanying drawings, in which a preferred embodiment of the invention is shown. This invention may, however, be embodied in many different forms including a complementary switching device and should not be construed as limited to the embodiment set forth herein. Rather, this embodiment is provided so that this disclosure will be thorough and complete, and will fully convey the scope of the invention to those skilled in the art. Like numbers refer to like elements throughout.

Figure 1A:
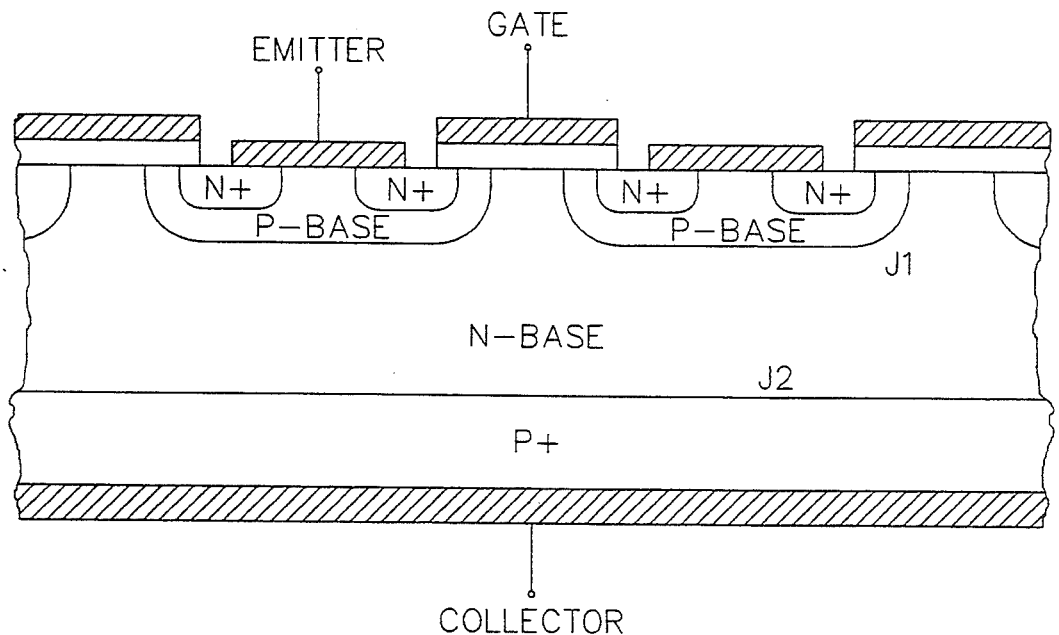
FIG. 1A illustrates a cross-sectional representation of a prior art Insulated Gate Bipolar Transistor (IGBT).
Figure 1B:
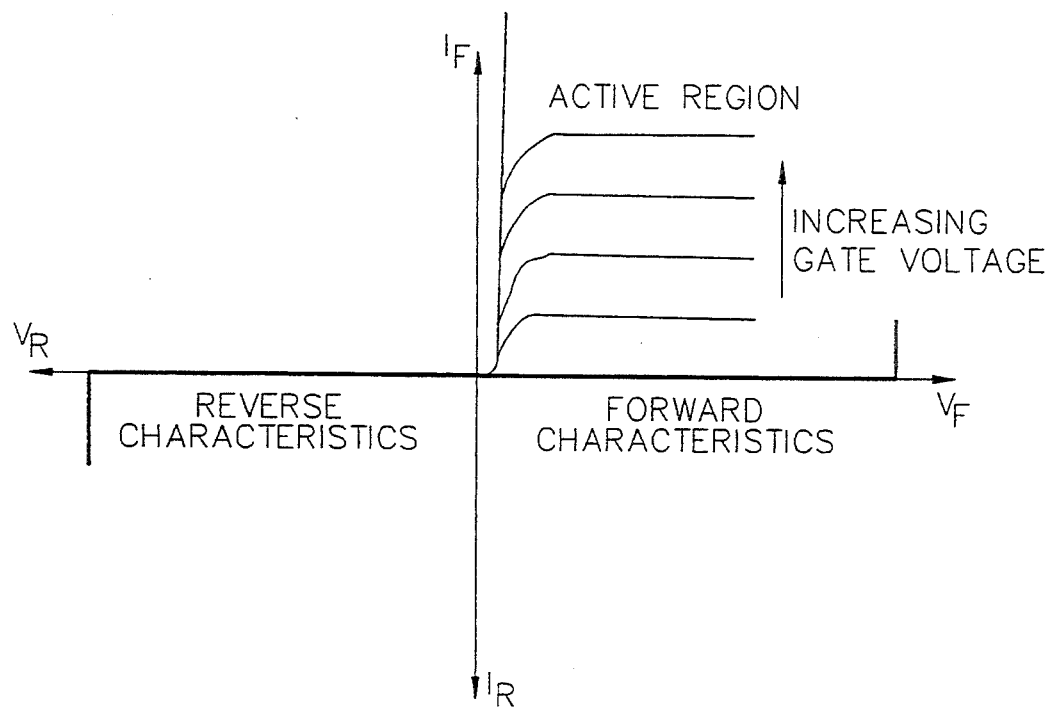
FIG. 1B illustrates a prior art graph of current versus collector voltage for the IGBT of FIG. 1A, at incremental gate biases.
Figure 2:
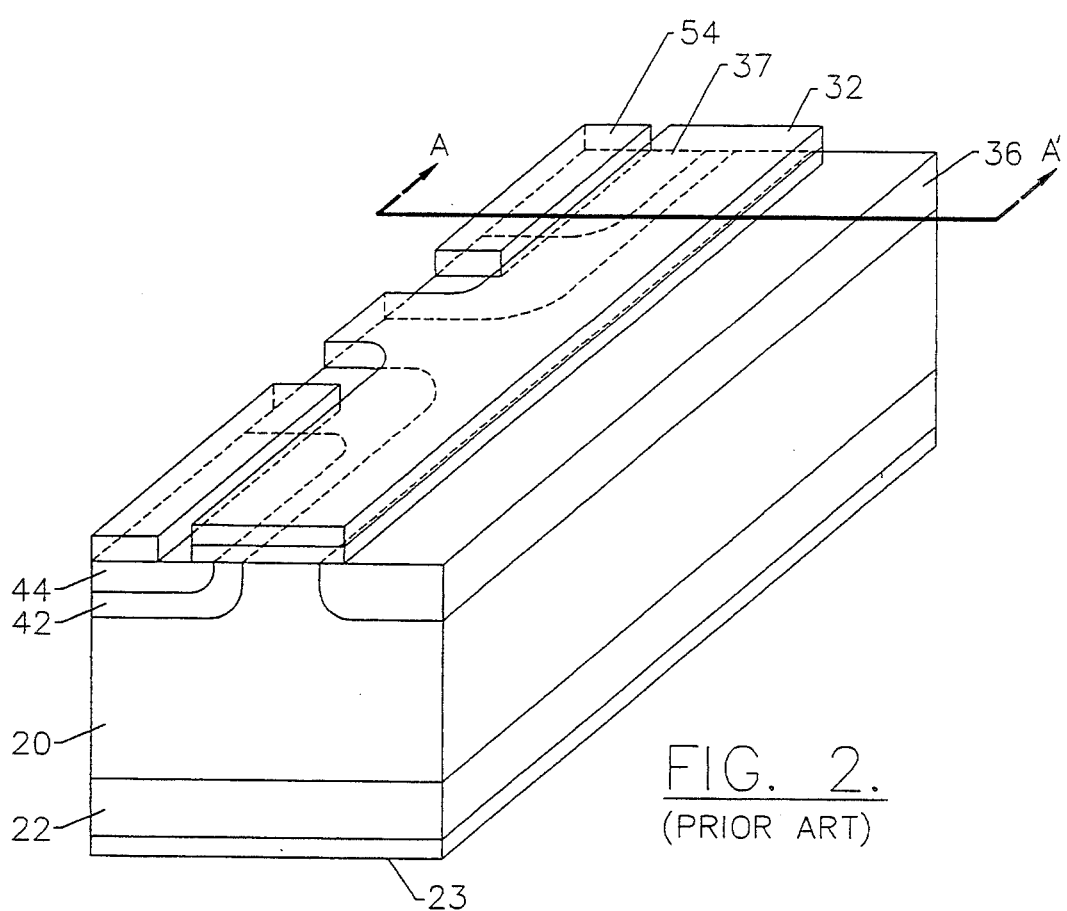
FIG. 2 illustrates a cross-sectional representation of a prior art base resistance controlled thyristor (BRT), according to FIG. 7 of U.S. Pat. No. 5,099,300 to Baliga.
Figure 3:
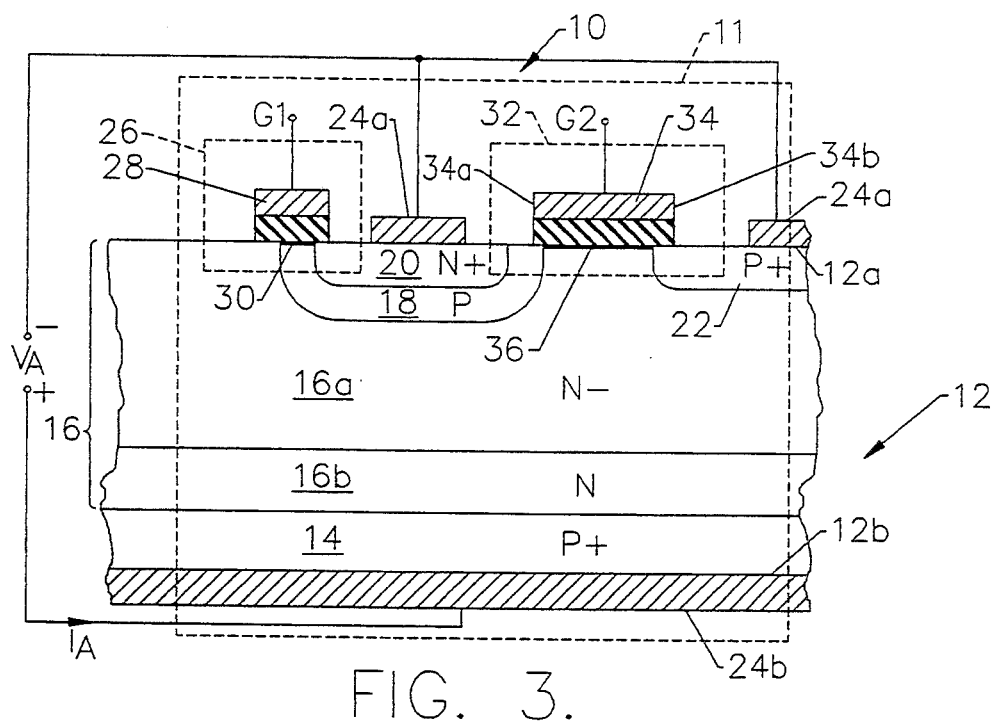
FIG. 3 illustrates a cross-sectional representation of a dual-gated semiconductor switching device according to a first embodiment of the present invention.

Referring now to FIG. 3, a first embodiment of a dual-gated semiconductor switching device according to the present invention will be described. The switching device 10 has the capability of electrically conducting in a regenerative mode of operation as a base resistance controlled thyristor (BRT) or conducting in a non-regenerative mode of operation as an insulated gate bipolar transistor (IGBT). In particular, the switching device 10 comprises a semiconductor substrate 2 and a P-N-P-N thyristor in the substrate, extending between opposing faces 12a and 12b, thereof. To achieve high levels of integration for high current applications, the device 10 may include a plurality of adjacent parallel connected switching cells 11 in the substrate 12. The thyristor is formed by: an anode region 14 (shown as P-type), a first base region 16 (shown as N-type regions 16a and 16b ) which extends to the first face 12a and forms a P-N junction with the anode region; a second base region 18; and a cathode region 20, which is in the second base region 18 and forms a P-N junction therewith.

A relatively highly doped diverter region 22 (shown as P-type) is also provided in the substrate 12. The diverter region 22 is preferably positioned outside and adjacent the second base region 18. As shown, the diverter region 22 forms a P-N junction with the first base region 16 and extends to the first face 12a. The first base region 16 preferably comprises relatively lightly and heavily doped regions 16a (drift region) and 16b (buffer region), as shown. A cathode contact 24a, which ohmically contacts the diverter region and cathode region 20, is also provided at the first face 12a and an anode contact 24b is provided at the second face 12b.

To enable regenerative and non-regenerative conduction in the switching device 10, a first insulated-gate field effect transistor 26, having an active region in the second base region 18, is preferably provided at the first face 12a, as shown. As will be understood by those skilled in the art, the application of a sufficiently positive bias to gate electrode 28 will cause the formation of a conductive inversion-layer channel 30 in the second base region 18. The inversion-layer channel 30 electrically connects the cathode region 20 to the first base region 16 and provides base drive current to the base of the P-N-P transistor formed by regions 14–18, upon the application of a sufficiently positive bias to the anode contact 24b. The occurrence of a sufficient base drive current will cause the sum of the current gains of the cross-coupled P-N-P and N-P-N transistors formed by regions 14–18 and 16–20, respectively, to exceed unity and cause the thyristor to latch-up in a regenerative mode of operation.

In contrast to conventional BRTs, the present invention also includes a separately controllable insulated-gate field effect transistor 32 which has a drain region in the second base region 18 and a second gate electrode 34 at the first face 12a. To obtain independent control of transistor 32, the second gate electrode 34 is electrically disconnected from the first gate electrode 28. Furthermore, to prevent the second transistor 32 from being able to initiate regenerative conduction in the device 10, the gate electrode 34 can be designed to have first and second ends 34a and 34b which overly the second base region 18 and the diverter region 22, respectively. Accordingly, the first end 34a can be patterned to extend over the second base region 18, but not over the cathode region 20. However, the gate 34 can also be used to define the lateral extent of the cathode region 20 in the second base region 18, by acting as a mask during processing of the device 10. Although not shown, the capability of blocking anode voltages at zero gate bias is provided by a one or more electrical connections between the second base region 18 and the cathode region 20. These connections extend in a third dimension, orthogonal to the cross-section.

To initiate non-regenerative conduction in the device 10, the second base region 18 is electrically connected to the diverter region via a conductive channel 36, which can be a P-type inversion-layer channel, as shown, or an accumulation-layer channel. The formation of a P-type channel 36 lowers the effective resistance of the P-base 18 and inhibits the forward biasing of the P-N junction formed by regions 18 and 20. Non-regenerative conduction in the device 10 can be made to occur prior to latching the thyristor in a regenerative mode (i.e., latch-up) as well as after the occurrence of latch-up in order to prevent sustained parasitic latch-up when the device 10 is supposed to be off, but the anode region 14 remains held at a positive bias with respect to the cathode region 20.

Figure 4:
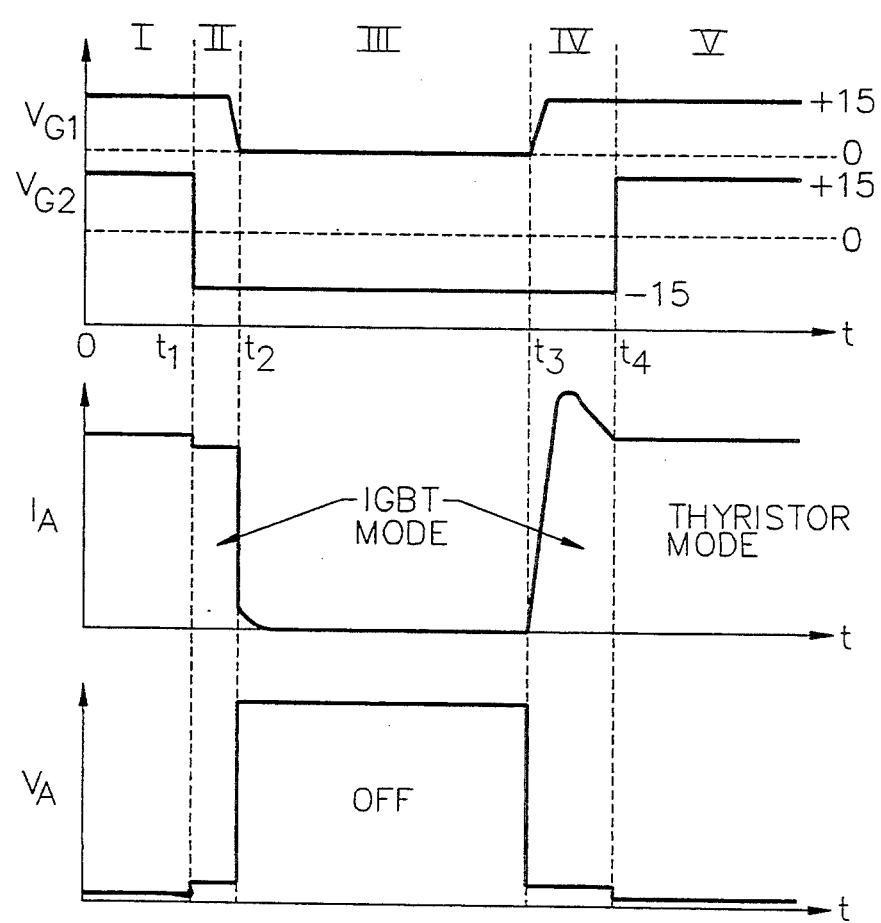
FIG. 4 graphically illustrates anode voltage ($V_A$), anode current ($I_A$) and gate bias ($V_{G1}$, $V_{G2}$) versus time (t), according to a preferred method of operating a switching device according to the present invention.

A preferred method for operating the device 10 includes the initiation of non-regenerative conduction prior to and after regenerative conduction (i.e., latch-up), as graphically illustrated by FIG. 4. In particular, FIG. 4 shows graphs of (i) gate bias ($V_{G1}$ and $V_2$), (ii) anode current (IA) and (iii) anode voltage (VA) as functions of time (t), where $V_{G1}$ corresponds to the gate bias applied to electrode 28 and $V_{G2}$ corresponds to the gate bias applied to electrode 34. As shown, regions I and V correspond to the regenerative (referred to as "thyristor") mode of operation when the device 10 has a high forward current density and low on-state voltage drop.

Regions II and IV correspond to the non-regenerative (referred to as "IGBT") mode of operation, when channels 30 and 36 electrically connect the cathode region 20 to the first base region 16 and the second base region 18 to the diverter region 22, respectively. In the IGBT mode of operation the device 10 exhibits only slightly higher voltage drop than in the thyristor mode of operation. Moreover, because the device 10 is to begin conducting as an IGBT at time the rate of rise of the current $I_A$ in region IV can be controlled by the rate of rise of the bias applied to gate electrode 2S (i.e., $V_{G1}$).

Finally, region III corresponds to the off-state, when channel 30 is removed. In the off-state, the device 10 is capable of blocking a large forward anode bias. By initiating an IGBT mode of operation at time $t_1$ before completely turning off the device 10 at time $t_2$, turn-off can be performed in a controlled manner with good Safe-Operating-Area (SOA). This is because the device 10 is operating as an IGBT which can be turned off relatively easily, as opposed to a thyristor which is harder to turn off because the thyristor is conducting in a regenerative mode and the base-cathode P-N junction is forward-biased.

Thus, a method according to the present invention includes the steps of enabling non-regenerative conduction in a portion of the thyristor (i.e., the P-N-P transistor formed by regions 14–18). As shown by region IV, enabling non-regenerative conduction can occur by (i) biasing the anode region 14 positively with respect to the cathode region 20; (ii) electrically connecting the second base region 18 to the diverter region 22 in response to the application of a second bias signal (shown as −15 V) to gate electrode 34; and (iii) electrically connecting the first base region 16 to the cathode region 20 in response to the application of a first bias signal (shown as +15 V) to gate electrode 28. Step (iii) may be performed after or simultaneously with step (ii). The electrical connections are shown by inversion-layer channels 36 and 30, respectively. In addition, once the thyristor formed by regions 14–20 is regeneratively latched, non-regenerative conduction can be enabled by electrically connecting the P-base region 18 to the P+ diverter region 22 via channel 36 in order to prevent the injection of electrons from the cathode region 20 to the second base region 18.

As will be understood by those skilled in the art, the inversion-layer channel 30 enables the supply of majority charge carriers (electrons) to the first base region 16, which is the base of the lowermost P-N-P-transistor formed by regions 14–18, when the anode region 14 is appropriately biased. Furthermore, the inversion-layer channel 36 prevents regenerative conduction between the coupled P-N-P and N-P-N transistors formed by regions 14–18 and 16–20, respectively, by shunting majority charge carriers (holes) from the second base region 18 to the diverter region 22 and to the cathode contact 24a. Accordingly, the formation of the channel 36 electrically "shorts" the second base region 18 to the cathode contact 24a and inhibits the injection of majority charge carriers (electrons) from the cathode region 20 to the second base region 18.

Next, as shown by regions I and V, regenerative conduction in the thyristor can be enabled by electrically disconnecting the second base region 18 from the diverter region 22 in response to the removal of the second bias signal from gate electrode 34. In particular, by applying a zero or positive bias to gate electrode 34, the inversion-layer channel 36, extending in the first base region 16, can be eliminated. Upon the elimination of the inversion-layer channel 36, MOS-gated control is provided solely by the first insulated-gate transistor 26.

Referring now to region III of FIG. 4, the device 10 may be rendered nonconductive by eliminating the inversion-layer channel 30, while preferably maintaining the channel 36 between the second base region 18 and the diverter region 22 in order to sweep away any remaining majority carriers in the second base region.

Simulations of the invention shown that dual-gated semiconductor switching devices 10 which have nominal blocking voltage ratings of 600 and 3000 Volts can be achieved with epitaxially-grown and bulk silicon substrates, respectively, having the parameters set forth in TABLE I. The donor or acceptor concentrations ($N_D$ or $N_A$) are expressed on a per cubic centimeter basis. The concentrations for the second base, cathode and diverter regions (regions 18–22) correspond to the expected "post-diffusion" surface concentrations at the face 12a.

TABLE I

| Region | $N_D$ or $N_A$ | Thickness/Depth 600 V | Thickness/Depth 3000 V | Material |
|---|---|---|---|---|
| ANODE-14 | $1 \times 10^{19}$ | 500μ | 10μ | P-Si |
| BUFFER-16b | $5 \times 10^{16}$ | 10μ | 0 | N-Si |
| DRIFT-16a | $5 \times 10^{13}$ | 50μ | 300μ | N-Si |
| SECOND BASE-18 | $1 \times 10^{18}$ | 3μ | 3μ | P-Si |
| CATHODE-20 | $1 \times 10^{19}$ | 1μ | 1μ | N-Si |
| DIVERTER-22 | $1 \times 10^{19}$ | 1μ | 1μ | P-Si |
| GATE 1-28 | $1 \times 10^{19}$ | — | — | N-Poly |
| GATE 2-34 | $1 \times 10^{19}$ | — | — | N-Poly |
| CATHODE CONTACT-24a | — | 3μ | 3μ | Metal |
| ANODE CONTACT-24b | — | 3μ | 3μ | Metal |

Figure 5:
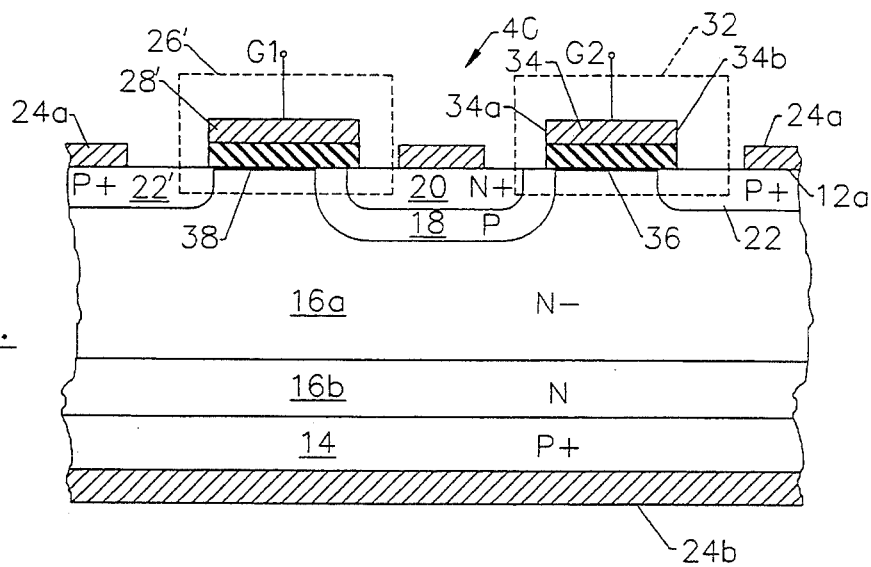
FIG. 5 illustrates a cross-sectional representation of a dual-gated semiconductor switching device according to a second embodiment of the present invention.

Referring now to FIG. 5, a second embodiment of a switching device 40, according to the present invention is shown. In particular, the switching device 40 may comprise a second diverter region 22'. As shown, the gate electrode 28' for the first insulated-gate transistor 26' extends over the second base region 18 as well as the second diverter region 22'. Thus, by applying a sufficiently negative gate bias (e.g., $V_{G1} = -15$ V) to electrode 28', an inversion layer channel 38 can be formed in the first base region 16. The channel 38 acts in parallel with the channel 36 to lower the effective P-base resistance even further, by shunting additional majority charge carriers to the cathode contact 24a and preventing the injection of majority charge carriers into the cathode region 20. Accordingly, the use of the second diverter region 38 enables the device 40 to handle larger forward current densities and to be turned off faster at time $t_2$.

Figure 6:
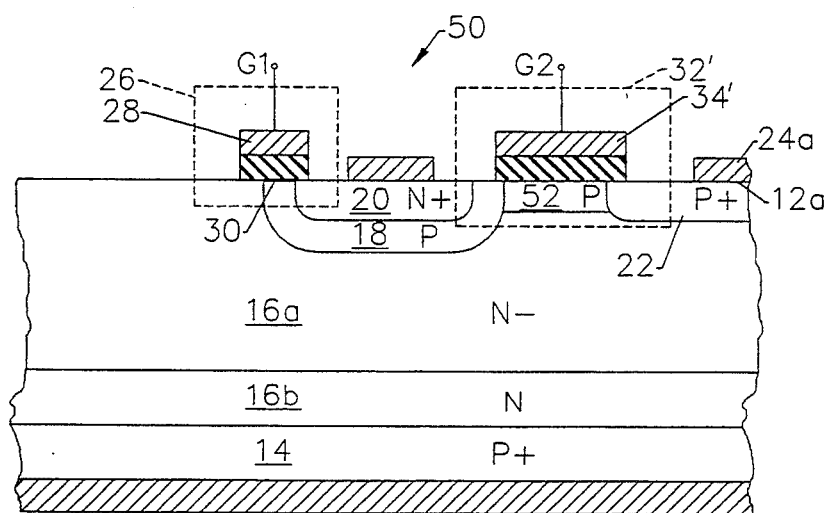
FIG. 6 illustrates a cross-sectional representation of a dual-gated semiconductor switching device according to a third embodiment of the present invention.

Referring now to FIG. 6, a third embodiment of a switching device 50, according to the present invention, is shown. Switching device 50 is similar to device 10, however, a P-type region 52 is provided in the first base region 16. Thus, insulated-gate transistor 32' comprises a depletion-mode MOSFET, instead of the enhancement-mode MOSFET 32 of FIG. 3. The application of a sufficiently positive gate bias to electrode 34' will deplete region 52 of holes and electrically disconnect the diverter region 22 from the second base region 18. However, the application of a negative gate bias to electrode 34' will cause the formation of a low resistance accumulation-layer channel in the P-type region 52. The resistance of the accumulation-layer channel is typically less than the resistance of the inversion-layer channel 36 of device 10. As will be understood by those skilled in the art, the incorporation of a P-type region 52 will typically enable the device 50 to be turned off at higher forward current levels than the device 10 of FIG. 3, which includes an enhancement mode transistor 32.

Figure 7:
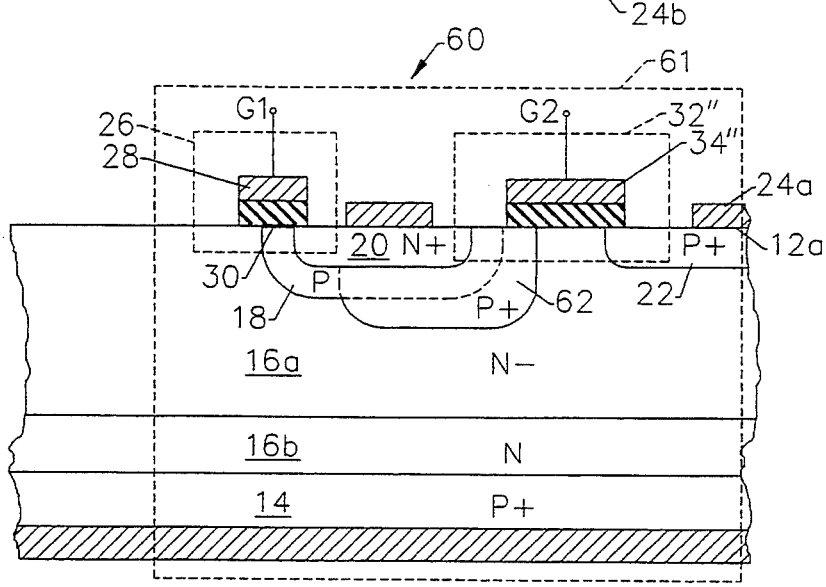
FIG. 7 illustrates a cross-sectional representation of a dual-gated semiconductor switching device according to a fourth embodiment of the present invention.

Referring now to FIG. 7, a fourth embodiment of a switching device 60 according to the present invention is shown. The switching device unit cell 61 is similar to cell 11, but also includes a third base region 62 in the first base region 16. The third base region 62 is more highly doped than the second base region 18 and forms a non-rectifying junction therewith, as shown. Accordingly, the application of a negative gate bias to gate electrode 34"causes the formation of an inversion-layer channel between the third base region 62 and the diverter region 22. As will be understood by those skilled in the art, the inclusion of a relatively highly doped third base region 62 reduces the resistance of the P-base (regions 18 and 62) and therefore reduces the possibility that the switching device 60 will experience sustained parasitic latch-up in the IGBT mode of operation. The inclusion of the third base region 62 may also effect the injection efficiency of the N+cathode region 20, when operating in the thyristor mode of operation, and cause a slightly higher on-state voltage drop.

Figure 8:
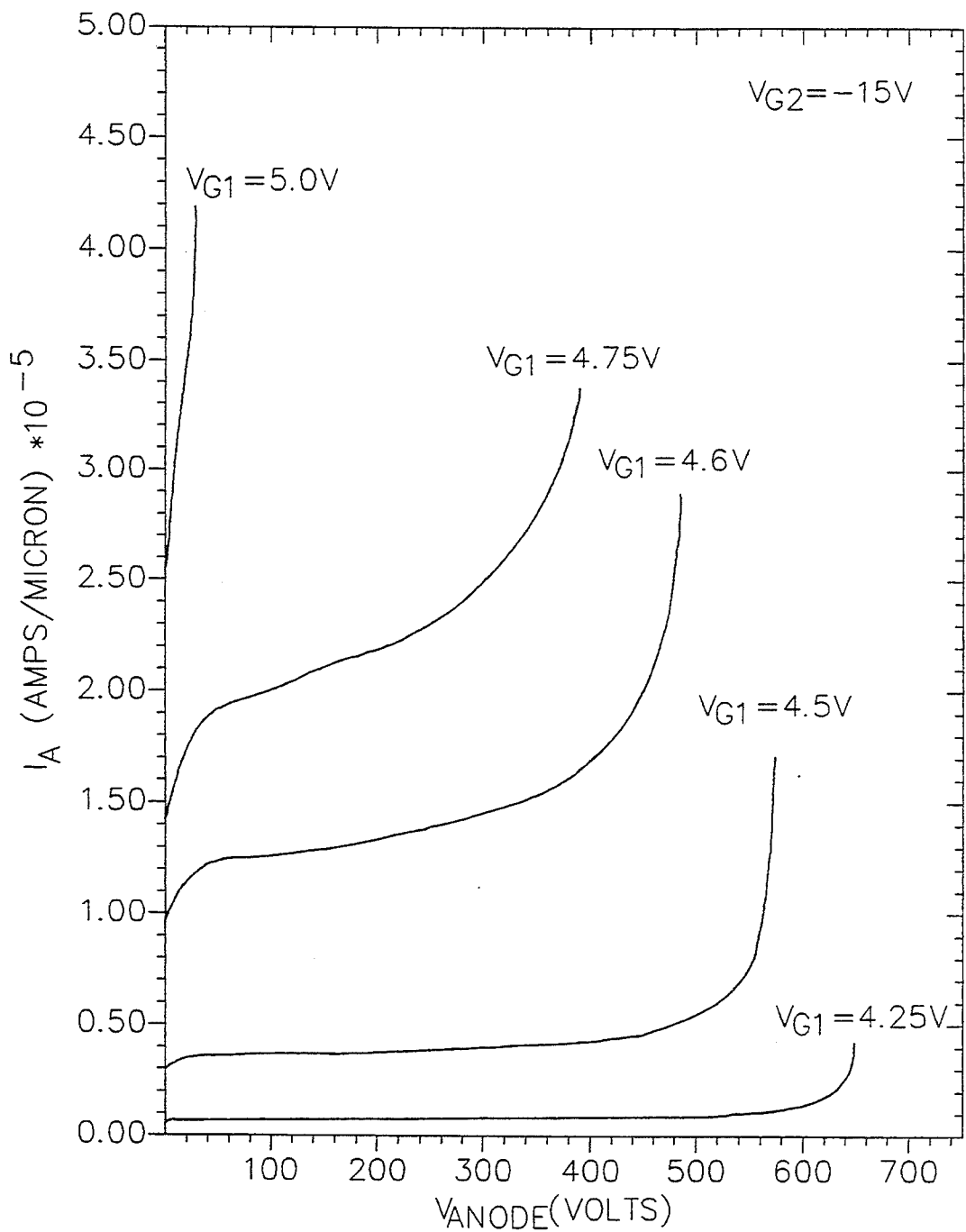
FIG. 8 graphically illustrates anode current ($I_a$) versus anode bias ($V_A$) for a unit cell switching device according to the fourth embodiment of the present invention.

Referring now to FIG. 8, a graphical illustration of simulated anode current ($I_A$) versus anode bias ($V_A$) for the unit cell 61 is provided. As shown, the unit cell 61 exhibits current saturation with $V_{G2} = -15$ V and $V_{G1} = \{4.25, 4.5, 4.6, 4.75, 5.0$ V$\}$. The unit cell 61 has a width of 19 microns and has parameters as set forth in TABLE II. The anode current ($I_A$) is proportional to the length of the unit cell which extends in a third dimension, orthogonal to the cross-sectional view of FIG. 7. Referring to TABLE II, donor or acceptor concentrations ($N_D$ or $N_A$) are expressed on a per cubic centimeter basis. The concentrations for the second base, cathode and diverter regions (regions 18–22) and third base region 62 correspond to the expected "post-diffusion" surface concentrations at the face 12a.

TABLE II

| Region | $N_D$ or $N_A$ | Thickness | Material |
|---|---|---|---|
| ANODE-14 | $1 \times 10^{19}$ | 500μ | P-Si |
| BUFFER-16b | $5 \times 10^{16}$ | 10μ | N-Si |
| DRIFT-16a | $8 \times 10^{13}$ | 50μ | N-Si |
| SECOND BASE-18 | $2 \times 10^{17}$ | 3μ | P-Si |
| THIRD BASE-62 | $1 \times 10^{19}$ | 3μ | P-Si |
| CATHODE-20 | $1 \times 10^{20}$ | 1μ | N-Si |
| DIVERTER-22 | $1 \times 10^{19}$ | 1μ | P-Si |
| GATE 1-28 | $1 \times 10^{19}$ | — | N-Poly |
| GATE 2-34 | $1 \times 10^{19}$ | — | N-Poly |
| CATHODE CONTACT-24a | — | 3μ | Metal |
| ANODE CONTACT-24b | — | 3μ | Metal |

Figure 9:
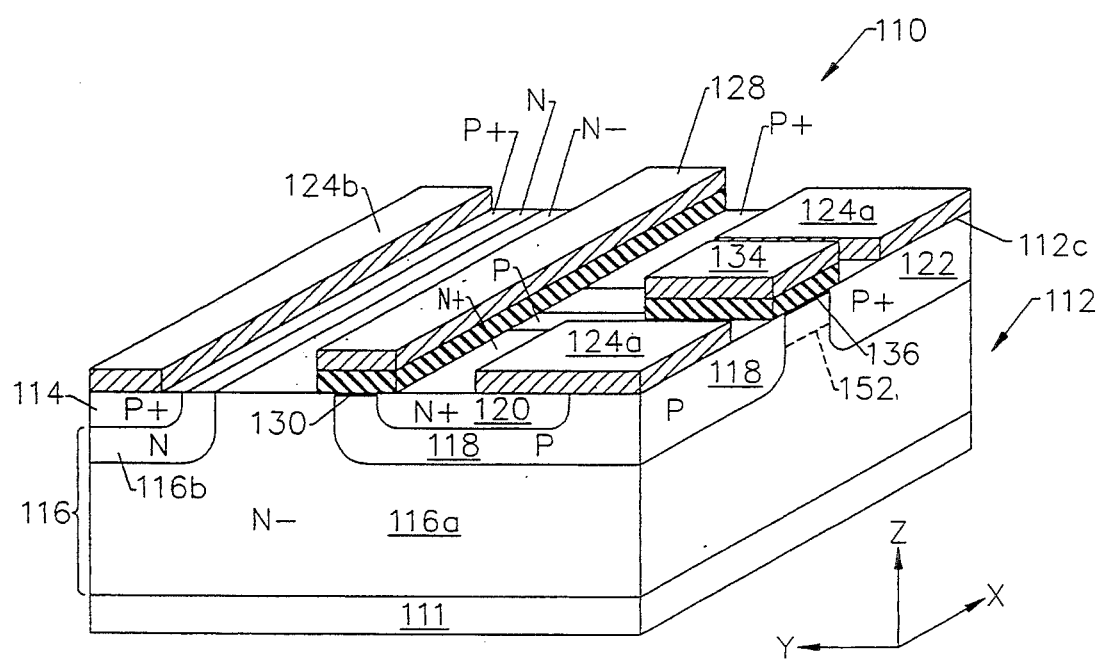
FIG. 9 illustrates a cross-sectional representation of a dual-gated semiconductor switching device according to a fifth embodiment of the present invention.

Referring now to FIG. 9, a fifth embodiment of the present invention will be described. In particular, a monolithic multifunctional switching device 110 is provided in a semiconductor substrate 112, having a face 112c thereon. An insulating or second conductivity type region 111 may also be provided adjacent the first base region 116, at an opposing face of the substrate 112. The device includes adjacent P-N-P-N regions 114–110 in the substrate, which extend between an anode contact 124b and a cathode contact 24a on the face 12c. These regions include an anode region 114, a first base region 116 (shown as buffer region 16b and drift region 116a), a second base region 118 and a cathode region 120. Regions 114–120 collectively form cross-coupled P-N-P and N-P-N transistors which can provide regenerative conduction (i.e., latch) when the anode contact 124b is biased positive with respect to the cathode contact 124a. The anode contact 124b and cathode contact 124a ohmically contact the anode region 114 and cathode region 120, respectively.

Means for enabling regenerative conduction in the cross-coupled transistors is also preferably provided by a first insulated gate field effect transistor having a gate electrode 128 and a gate insulating region, as shown. In response to the application of a first bias signal (e.g., positive), an N-type inversion layer channel 130 is formed in the second base region 118. This inversion layer electrically connects the cathode region 120 to the first base region 116 and provides electrons to the base of the lateral P-N-P transistor formed by regions 114–118. The first insulated gate transistor may comprise an enhancement-mode transistor, shown as an N-channel MOSFET.

Means for disabling regenerative conduction and enabling non-regenerative conduction in the P-N-P transistor formed by regions 114–118 is preferably provided by a second insulated gate field effect transistor having a gate electrode 134 and a gate insulating region, as shown. The second insulated gate field effect transistor may comprise an enhancement-mode transistor, shown as a P-channel MOSFET. Accordingly, in response to the application of a second bias signal (e.g., negative), a P-type inversion layer channel 136 is formed in the drift region 116a. This inversion layer electrically connects the second base region 118 to an adjacent diverter region 122. The diverter region 122 ohmically contacts the cathode contact 124a at the face 112c. As shown by dotted lines, a second conductivity type region 152 may also be provided in the first base region, between the diverter region 122 and the second base region 118. Therefore, the second insulated gate transistor may comprise a depletion-mode transistor as well.

As further shown in FIG. 9, the anode region 114 of the lateral thyristor formed by regions 114–120 is preferably disposed in a first direction (y-direction) with respect to the second base region 18 and the diverter region 121 is preferably disposed in a second direction (x-direction) with respect to the second base region 18. The capability of blocking anode voltages at zero gate bias is provided by the cathode electrode 124a, which electrically connects the second base region 118 to the cathode region 120 on a side opposite the anode region 114. In particular, the cathode contact 24a extends from the cathode region 120 to the second base region 118 in a third direction (negative y-direction), opposite the first direction.

As will be understood by those skilled in the art, because the ohmic contact between the second base region 118 and the cathode contact 124a is on a side of the cathode region 120 which is opposite the anode region 114, latch-up of the P-N-P-N regions 14–20 can be maintained when the anode region 114 is biased positively with respect to the cathode region 120 and regenerative conduction is enabled. This is because majority carriers (holes) in the second base region 118 must flow laterally underneath the cathode region 120 before they become influenced by the electrical "short" between the cathode contact 124a and the second base region 118, at the face. In particular, the lateral transfer of holes causes a potential drop between the anode side and the "shorted" side of the cathode region 120. The device 110 is preferably designed so that the potential drop is sufficient to maintain a forward bias at the P-N junction between the cathode region 120 and the second base region 118, when the device 110 is in a regenerative mode of conduction.

As described above, the present invention includes a multifunctional semiconductor switching device having both regenerative and non-regenerative modes of operation and separately controllable gate electrodes. A non-regenerative/IGBT mode of operation is preferably initiated before and after the device is latched into a regenerative mode of operation as a thyristor. This improves the gate-controlled turn-on and turn-off capability of the device and improves the device's I-V characteristics by providing current saturation and inhibiting sustained parasitic latch-up.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of operating a base resistance controlled thyristor having an anode region, a first base region of first conductivity type, a second base region of second conductivity type which forms a P-N junction with said first base region, a cathode region of said first conductivity type which forms a P-N junction with said second base region and a diverter region of said second conductivity type which forms a P-N junction with said first base region, comprising the steps of:

enabling regenerative conduction in said thyristor by electrically connecting said cathode region to said first base region in response to an application of a first bias signal and biasing said anode region to a first polarity relative to said cathode region;

disabling regenerative conduction in said thyristor and enabling non-regenerative conduction in the transistor formed by said anode region, said first base region and said second base region, by electrically connecting said second base region to said diverter region in response to an application of a second bias signal having a polarity opposite said first bias signal, during the application of said first bias signal; and electrically disconnecting said cathode region from said first base region, by removing said first bias signal, to thereby inhibit regenerative and non-regenerative conduction between said anode region and said cathode region.

2. The method of operating a base resistance controlled thyristor according to claim 1, further comprising the step of:

enabling non-regenerative conduction in said transistor by biasing said anode region to the first polarity relative to said cathode region and by electrically connecting said second base region to said diverter region in response to an application of said second bias signal and electrically connecting said first base region to said cathode region in response to an application of said first bias signal.

3. The method of operating a base resistance controlled thyristor according to claim 2, wherein said non-regenerative conduction enabling step is followed by the step of:

enabling regenerative conduction in said thyristor by electrically disconnecting said second base region from said diverter region.

4. A method of operating a base resistance controlled thyristor having an anode region, a first base region of first conductivity type, a second base region of second conductivity type, a cathode region of said first conductivity type and a diverter region of said second conductivity type, comprising the steps of:

biasing said anode region to a first polarity with respect to said cathode region;

electrically connecting said cathode region to said first base region to turn on and latch said thyristor in a regenerative mode of conduction; and then electrically connecting said second base region to said diverter region to suppress said regenerative mode of conduction, while allowing a non-regenerative mode of conduction between said anode region, said first base region and said second base region; and then electrically disconnecting said cathode region from said first base region to suppress said non-regenerative mode of conduction;

wherein said step of electrically connecting said second base region to said diverter region comprises the step of forming an electrically conductive channel of said second conductivity type in said first base region.

5. The method of operating a base resistance controlled thyristor according to claim 4, wherein said step of electrically connecting said cathode region to said first base region is responsive to an application of a first bias signal and said step of electrically connecting said second base region to said diverter region is responsive to an application of a second bias signal.

6. A method of operating a base resistance controlled thyristor having an anode region, a first base region, a second base region, a cathode region and a diverter region therein, comprising the steps of:

biasing said anode region to a first polarity with respect to said cathode region;

electrically connecting said cathode region to said first base region to turn on and latch said thyristor in a regenerative mode of conduction; and then electrically connecting said second base region to said diverter region to suppress said regenerative mode of conduction, while allowing a non-regenerative mode of conduction between said anode region, said first base region and said second base region; and then electrically disconnecting said cathode region from said first base region to suppress said non-regenerative mode of conduction and turn off said thyristor;

wherein said step of electrically connecting said cathode region to said first base region is responsive to an application of a first bias signal of said first polarity and said step of electrically connecting said second base region to said diverter region is responsive to an application of a second bias signal of second polarity, opposite said first polarity.

7. The method of operating a base resistance controlled thyristor according to claim 4, wherein said anode region biasing step is preceded by the steps of:

biasing said anode region to a first polarity with respect to said cathode region;

electrically connecting said second base region to said diverter region; and electrically connecting said cathode region to said first base region to turn on said thyristor in said non-regenerative mode of conduction.

8. The method of operating a base resistance controlled thyristor according to claim 5, wherein said electrically disconnecting step is responsive to a removal of said first bias signal.

9. The method of operating a base resistance controlled thyristor according to claim 4, wherein said electrically disconnecting step is followed by the steps of:

electrically connecting said second base region to said diverter region; and electrically connecting said first base region to said cathode region.

10. The method of operating a base resistance controlled thyristor according to claim 4, wherein said electrically disconnecting step is followed by the step of:

simultaneously electrically connecting said second base region to said diverter region and electrically connecting said first base region to said cathode region to turn on said thyristor in said non-regenerative mode of conduction.

11. The method of operating a base resistance controlled thyristor according to claim 4, wherein said electrically disconnecting step is followed by the steps of:

electrically connecting said second base region to said diverter region in response to an application of a second bias signal; and electrically connecting said first base region to said cathode region in response to an application of a first bias signal.

12. The method of operating a base resistance controlled thyristor according to claim 4, wherein said electrically disconnecting step is followed by the steps of:

electrically connecting said second base region to said diverter region in response to an application of a second bias signal;

electrically connecting said first base region to said cathode region in response to an application of a first bias signal; and subsequently, electrically disconnecting said second base region from said diverter region.

13. A method of operating a base resistance controlled thyristor, comprising the steps of:

applying a first bias signal of a first polarity to turn on and latch said thyristor in a regenerative mode of conduction;

applying a second bias signal of a second polarity, opposite said first polarity, to suppress said regenerative mode of conduction, while allowing a non-regenerative mode of conduction in a portion of said thyristor; and removing said first bias signal to turn off said portion of said thyristor by suppressing said non-regenerative mode of conduction.

14. The method of operating a base resistance controlled thyristor according to claim 13, further comprising the steps of:

applying said second bias signal and then said first bias signal in sequence to turn-on said portion by facilitating said non-regenerative mode of conduction therein; and removing said second bias signal to latch said thyristor in said regenerative mode of conduction.

15. The method of operating a base resistance controlled thyristor according to claim 13, wherein said first bias signal applying step is preceded by the steps of:

biasing an anode of said thyristor to said first polarity relative to a cathode of said thyristor;

applying said second bias signal and applying said first bias signal to turn on said portion by allowing said non-regenerative mode of conduction therein; then removing said second bias signal to turn on and latch said thyristor in said regenerative mode of conduction; then applying said second bias signal to suppress said regenerative mode of conduction; and then removing said first bias signal and said second bias signal to prevent conduction from the anode to the cathode.

16. The method of operating a base resistance controlled thyristor according to claim 13, wherein said first bias signal applying step comprises the steps of:

applying said second bias signal and applying said first bias signal to turn on said portion by allowing said non-regenerative mode of conduction therein; and subsequently removing said second bias signal to latch said thyristor in said regenerative mode of conduction.

17. A semiconductor switching device having gate-controlled regenerative and non-regenerative modes of operation, comprising:

a semiconductor substrate having first and second opposing faces;

an anode region extending to said first face;

a first base region of first conductivity type on said anode region, extending to said second face;

a second base region of second conductivity type in said first base region, at said second face;

a cathode region of first conductivity type in said second base region and forming a P-N junction therewith;

a diverter region of second conductivity type in said first base region, outside and adjacent said second base region;

a cathode contact on said second face, ohmically contacting said cathode region and said diverter region;

a first insulated gate field effect transistor having a first gate electrode on said second face and an active region in a first portion of said second base region, between said cathode region and said first base region; and a second insulated gate field effect transistor having a drain region in a second portion of said second base region, non-overlapping with said first portion, and a second gate electrode on said second face, electrically disconnected from said first gate electrode, said second gate electrode having first and second opposite ends thereof, overlying said second base region and said diverter region, respectively.

18. The semiconductor switching device of claim 17, wherein said first insulated gate transistor and said second insulated gate transistor comprise enhancement-mode MOSFETs.

19. The semiconductor switching device of claim 17, wherein said first insulated gate transistor comprises an enhancement-mode MOSFET and wherein said second insulated gate transistor comprises a depletion-mode MOSFET.

20. A semiconductor switching device having gate-controlled regenerative and non-regenerative modes of operation, comprising:

a semiconductor substrate having first and second opposing faces;

an anode region extending to said first face;

a first base region of first conductivity type on said anode region, extending to said second face;

a second base region of second conductivity type in said first base region, at said second face;

a third base region in said first base region, said third base region forming a non-rectifying junction with said second base region and having a second conductivity type doping concentration greater than that of said second base region;

a cathode region of first conductivity type in said second base region and forming a P-N junction with said third base region;

a diverter region of second conductivity type in said first base region, outside and adjacent said third base region;

a cathode contact on said second face, ohmically contacting said cathode region and said diverter region;

a first insulated gate field effect transistor having a first gate electrode on said second face and an active region in said second base region, between said cathode region and said first base region; and a second insulated gate field effect transistor having a drain region in said third base region and a second gate electrode on said second face, electrically disconnected from said first gate electrode.

21. The semiconductor switching device of claim 20, wherein said first insulated gate transistor and said second insulated gate transistor comprise enhancement-mode MOSFETs.

22. A semiconductor switching device having gate-controlled regenerative and non-regenerative modes of operation, comprising:
  a semiconductor substrate;
  a thyristor in said substrate, said thyristor having an anode region, a first base region, a second base region, and a cathode region in said second base region;
  a diverter region in said first base region, outside and adjacent said second base region, and electrically connected to said cathode region;
  a first insulated gate transistor having a first gate electrode on a face of said substrate and an active region in said second base region, between said cathode region and said first base region; and
  a second insulated gate transistor having a drain region in said second base region and a second gate electrode on said face, electrically disconnected from said first gate electrode and having first and second opposite ends thereof, overlying said second base region and said diverter region, respectively.

23. The semiconductor switching device of claim 22, wherein said first insulated gate transistor and said second insulated gate transistor comprise enhancement-mode MOSFETs.

24. The semiconductor switching device of claim 22, wherein said first insulated gate transistor comprises an enhancement-mode MOSFET and wherein said second insulated gate transistor comprises a depletion-mode MOSFET.

25. A semiconductor switching device having gate-controlled regenerative and non-regenerative modes of operation, comprising:
  a thyristor having an anode region, a first base region of first conductivity type, a second base region of second conductivity type, and a cathode region in said second base region;
  a diverter region in said first base region, outside and adjacent said second base region, and electrically connected to said cathode region;
  a third base region in said first base region and forming a non-rectifying junction with said second base region, said third base region having a second conductivity type doping concentration greater than that of said second base region; and
  insulated gate transistor means, including a drain region in said third base region, for shunting charge carriers from said second base region to said third base region and then to said diverter region, in response to a bias signal, to thereby suppress regenerative conduction in said thyristor.

26. The semiconductor switching device of claim 25, further comprising second insulated gate transistor means, including an active region in said second base region, for electrically connecting said cathode region to said first base region in response to a second bias signal.

27. The semiconductor switching device of claim 26, wherein said first insulated gate transistor means and said second insulated gate transistor means comprise first and second MOSFETs, respectively, having independently controllable gate electrodes.

28. A monolithic multifunctional semiconductor switching device having gate-controlled regenerative and non-regenerative conduction modes, comprising:
  a semiconductor substrate having first and second opposing faces;
  an anode contact on said first face;
  a cathode contact on said second face;
  cross-coupled P-N-P and N-P-N bipolar transistors in said substrate, extending between said anode contact and said cathode contact;
  means for enabling regenerative conduction in said cross-coupled P-N-P and N-P-N bipolar transistors, in response to a first bias signal of a first polarity; and
  means for disabling regenerative conduction in said cross-coupled P-N-P and N-P-N bipolar transistors and for enabling non-regenerative conduction in said P-N-P transistor, in response to a second bias signal of a second polarity, opposite said first polarity.

29. The monolithic multifunctional semiconductor switching device of claim 28, wherein said regenerative conduction enabling means comprises a first insulated gate transistor having a first gate electrode and wherein said regenerative conduction disabling means comprises a second insulated gate transistor having a second gate electrode, electrically disconnected from said first gate electrode.

30. The monolithic multifunctional semiconductor switching device of claim 29, wherein said regenerative conduction disabling means further comprises a diverter region in said substrate, ohmically connected to said cathode contact.

31. A semiconductor switching device having gate-controlled regenerative and non-regenerative modes of operation, comprising:
  a semiconductor substrate;
  a thyristor in said substrate, said thyristor having an anode region, a first base region, a second base region, and a cathode region in said second base region;
  a diverter region in said first base region, outside and adjacent said second base region, and electrically connected to said cathode region;
  a first insulated gate transistor having a first gate electrode on a face of said substrate and an active region in said second base region, between said cathode region and said first base region; and
  a second insulated gate transistor having a drain region in said second base region and a second gate electrode on said face, electrically disconnected from said first gate electrode.

32. The semiconductor switching device of claim 31, wherein said first insulated gate transistor and said second insulated gate transistor comprise first and second enhancement-mode MOSFETs, respectively.

33. The semiconductor switching device of claim 31, wherein said first insulated gate transistor comprises an enhancement-mode MOSFET and wherein said second insulated gate transistor comprises a depletion-mode MOSFET.

34. A monolithic multifunctional semiconductor switching device having gate-controlled regenerative and non-regenerative conduction modes, comprising:
  a semiconductor substrate having a face;
  an anode contact on said face;
  a cathode contact on said face, disposed adjacent said anode contact;
  cross-coupled P-N-P and N-P-N bipolar transistors in said substrate, extending between said anode contact and said cathode contact;
  means for enabling regenerative conduction in said cross-coupled P-N-P and N-P-N bipolar transistors, in response to a first bias signal of a first polarity; and means for disabling regenerative conduction in said cross-coupled P-N-P and N-P-N bipolar transistors and for enabling non-regenerative conduction in said P-N-P transistor, in response to a second bias signal of a second polarity, opposite said first polarity.

35. The monolithic multifunctional semiconductor switching device of claim 34, wherein said regenerative conduction enabling means comprises a first insulated gate transistor having a first gate electrode on said face and wherein said regenerative conduction disabling means comprises a second insulated gate transistor having a second gate electrode on said face, electrically disconnected from said first gate electrode.

36. The monolithic multifunctional semiconductor switching device of claim 35, wherein said cross-coupled P-N-P and N-P-N bipolar transistors comprise:
  an anode region of second conductivity type extending to said face;
  a second base region of second conductivity type extending to said face, said second base region disposed adjacent said anode region;
  a first base region of first conductivity type in said substrate, between said anode region and said second base region and forming P-N junctions therewith; and
  a cathode region of first conductivity type in said second base region at said face.

37. The monolithic multifunctional semiconductor switching device of claim 36, wherein said regenerative conduction disabling means further comprises a diverter region of second conductivity type extending to said face, said diverter region disposed adjacent said second base region and said anode region.

38. The monolithic multifunctional semiconductor switching device of claim 35, wherein said regenerative conduction disabling means comprises a diverter region of second conductivity type in said substrate, ohmically connected to said cathode contact.

39. A semiconductor switching device having gate-controlled regenerative and non-regenerative modes of operation, comprising:
  a semiconductor substrate having a face;
  an anode region of second conductivity type extending to said face;
  a second base region of second conductivity type extending to said face, said second base region disposed adjacent said anode region;
  a first base region of first conductivity type in said substrate, between said anode region and said second base region and forming P-N junctions therewith;
  a cathode region of first conductivity type in said second base region at said face;
  a diverter region of second conductivity type extending to said face, said diverter region disposed adjacent said second base region and said anode region;
  a cathode contact on said face, ohmically contacting said diverter region and said cathode region;
  first insulated gate transistor means at said face for electrically connecting said cathode region to said first base region by an electrically conductive channel of first conductivity type in said second base region, in response to a first bias signal; and
  second insulated gate transistor means at said face for electrically connecting said second base region to said diverter region by an electrically conductive channel of second conductivity type in said first base region, in response to a second bias signal.

40. A semiconductor switching device having gate-controlled regenerative and non-regenerative modes of operation, comprising:
  a semiconductor substrate having a face;
  an anode region of second conductivity type extending to said face;
  a second base region of second conductivity type extending to said face, said second base region disposed adjacent said anode region;
  a first base region of first conductivity type in said substrate, between said anode region and said second base region and forming P-N junctions therewith;
  a cathode region of first conductivity type in said second base region at said face;
  a diverter region of second conductivity type extending to said face, said diverter region disposed adjacent said second base region and said anode region;
  a cathode contact on said face, ohmically contacting said diverter region and said cathode region;
  first insulated gate transistor means at said face for electrically connecting said cathode region to said first base region in response to a first bias signal; and
  second insulated gate transistor means at said face for electrically connecting said second base region to said diverter region in response to a second bias signal;
  wherein said first insulated gate transistor means comprises an enhancement-mode MOSFET and wherein said second insulated gate transistor means comprises a depletion-mode MOSFET.

41. A semiconductor switching device having gate-controlled regenerative and non-regenerative modes of operation, comprising:
  a semiconductor substrate having a face;
  an anode region of second conductivity type extending to said face;
  a second base region of second conductivity type extending to said face, said second base region disposed adjacent said anode region;
  a first base region of first conductivity type in said substrate, between said anode region and said second base region and forming P-N junctions therewith;
  a cathode region of first conductivity type in said second base region at said face;
  a diverter region of second conductivity type extending to said face, said diverter region disposed adjacent said second base region and said anode region;
  a cathode contact on said face, ohmically contacting said diverter region and said cathode region;
  first insulated gate transistor means at said face for electrically connecting said cathode region to said first base region in response to a first bias signal; and
  second insulated gate transistor means at said face for electrically connecting said second base region to said diverter region in response to a second bias signal;
  wherein said anode region is disposed in a first direction with respect to said second base region and said diverter region is disposed in a second direction with respect to said second base region, orthogonal to said first direction.

42. The semiconductor switching device of claim 41, wherein said first base region comprises a drift region, between said second base region and said anode region, and a buffer region, between said drift region and said anode region, said drift region having a doping concentration less than said buffer region.

43. The semiconductor switching device of claim 41, wherein said cathode contact extends from said cathode region to said second base region in a third direction, opposite said first direction, and ohmically contacts said second base region at said face.

* * * * *

UNITED STATES PATENT AND TRADEMARK OFFICE
CERTIFICATE OF CORRECTION

PATENT NO. : 5,412,228

DATED : May 2, 1995

INVENTOR(S) : Bantval J. Baliga

It is certified that error appears in the above-indentified patent and that said Letters Patent is hereby corrected as shown below:

Col. 1, lines 9-11 should not be indented.

Col. 3, line 64, "pnp" (second occurrence) should be -- npn --.

Col. 6, line 37, "($I_a$)" should be -- ($I_A$) --.

Col. 6, line 66, "2" should be -- 12 --.

Col. 8, line 17, "(IA)" should be -- ($I_A$) --.

Col. 8, line 17, "(VA)" should be -- ($V_A$) --.

Col. 8, line 34, after "time" insert -- $t_3$, --.

Col. 8, line 36, "2S" should be -- 28 --.

UNITED STATES PATENT AND TRADEMARK OFFICE
CERTIFICATE OF CORRECTION

PATENT NO. : 5,412,228
DATED : May 2, 1995
INVENTOR(S) : Bantval J. Baliga

It is certified that error appears in the above-indentified patent and that said Letters Patent is hereby corrected as shown below:

Col. 11, line 25, "110" should be -- 120 --.

Col. 11, line 27, "24a" should be -- 124a --.

Col. 11, line 27, "12c" should be -- 112c --.

Col. 11, line 29, "16b" should be -- 116b --.
Col. 12, line 6, "18" should be --118 --.
Col. 12, line 7, "121" should be -- 122 --.

Col. 12, line 13, "24a" should be -- 124a --.

Col. 12, line 21, "14-20" should be -- 114-120 --.

Signed and Sealed this

Seventeenth Day of September, 1996

Attest:

BRUCE LEHMAN

*Attesting Officer*     *Commissioner of Patents and Trademarks*